(12) United States Patent
Zhou et al.

(10) Patent No.: US 11,742,842 B2
(45) Date of Patent: Aug. 29, 2023

(54) MULTI-PHASE CLOCK GENERATOR AND METHOD THEREOF

(71) Applicant: Shanghai Zhaoxin Semiconductor Co., Ltd., Shanghai (CN)

(72) Inventors: Yongqi Zhou, Beijing (CN); Yang Chen, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 17/823,996

(22) Filed: Sep. 1, 2022

(65) Prior Publication Data
US 2023/0121365 A1 Apr. 20, 2023

(30) Foreign Application Priority Data
Oct. 19, 2021 (CN) .......................... 202111214013.5

(51) Int. Cl.
*H03K 5/133* (2014.01)
*H03K 5/135* (2006.01)

(52) U.S. Cl.
CPC .............. *H03K 5/133* (2013.01); *H03K 5/135* (2013.01)

(58) Field of Classification Search
None
See application file for complete search history.

(56) References Cited

U.S. PATENT DOCUMENTS

| | | | | |
|---|---|---|---|---|
| 5,475,344 A | * | 12/1995 | Maneatis | ................ H03K 3/03 331/25 |
| 7,683,726 B2 | * | 3/2010 | Kim | ........................ H03K 5/133 331/45 |
| 9,209,745 B2 | * | 12/2015 | Beccue | ................ H03K 3/0315 |

* cited by examiner

*Primary Examiner* — Cassandra F Cox
(74) *Attorney, Agent, or Firm* — McClure, Qualey & Rodack, LLP (57) ABSTRACT

A multi-phase clock generator is provided in the application. The multi-phase clock generator includes a first oscillator circuit and a second oscillator circuit. The first oscillator circuit includes a plurality of first delay circuits. The first oscillator circuit receives the first number of multi-phase input clock signals and outputs the second number of first output clock signals, wherein the second number is larger than the first number. The second oscillator circuit is coupled to the first oscillator circuit. The second oscillator circuit includes a plurality of second delay circuits. The second oscillator circuit receives the second number of first output clock signals and outputs the second number of second output clock signals. The number of second delay circuits is less than the number of first delay circuits.

20 Claims, 11 Drawing Sheets

MULTI-PHASE CLOCK GENERATOR AND METHOD THEREOF

CROSS REFERENCE TO RELATED APPLICATIONS

This application claims priority of CN Patent Application No. 202111214013.5 filed on Oct. 19, 2021, the entirety of which is incorporated by reference herein.

BACKGROUND

Technical Field

The application generally relates to multi-phase clock generator technology, and more particularly, to a multi-phase clock generator which may generate multi-phase clock signals with same frequency.

Description of the Related Art

With recent developments in Electrical Physical layer (EPHY) technology and clock data recovery (CDR), a faster data rate in the EPHY is required. In addition, the requirement for the number of lanes has also increased in the EPHY.

However, if the data rate is increased (e.g., from 8G to 16G or 32G), some problems will occur. For example, when the data rate is increased, the oscillation frequency and the size of the LC voltage controlled oscillator (LCVCO) will be increased. In addition, in another example, a phase skew that does not match the design requirements may occur when the multi-path high frequency clocks are configured to the increased lanes.

BRIEF SUMMARY

Multi-phase clock generators and multi-phase clock-generating methods are provided to overcome the problems mentioned above.

An embodiment of the application provides a multi-phase clock generator. The multi-phase clock generator includes a first oscillator circuit and a second oscillator circuit. The first oscillator circuit comprises a plurality of first delay circuits. The first oscillator circuit receives the first number of multi-phase input clock signals and outputs the second number of first output clock signals, wherein the second number is larger than the first number. The second oscillator circuit is coupled to the first oscillator circuit. The second oscillator circuit comprises a plurality of second delay circuits. The second oscillator circuit receives the second number of first output clock signals and outputs the second number of second output clock signals. The number of second delay circuits is less than the number of first delay circuits.

An embodiment of the application provides a multi-phase clock-generating method. The multi-phase clock-generating method is applied to a multi-phase clock generator. The multi-phase clock-generating method includes the following steps. A first oscillator circuit of the multi-phase clock generator receives a plurality of multi-phase input clock signals, wherein the first oscillator circuit comprises a plurality of first delay circuits. The first oscillator circuit outputs a plurality of multi-phase first output clock signals based on the multi-phase input clock signals, wherein the number of multi-phase first output clock signals is larger than the number of multi-phase input clock signals. A second oscillator circuit of the multi-phase clock generator receives the multi-phase first output clock signals, wherein the second oscillator circuit comprises a plurality of second delay circuits. The second oscillator circuit outputs a plurality of multi-phase second output clock signals, wherein the number of second delay circuits is less than the number of first delay circuits, and the number of multi-phase second output clock signals is the same as the number of multi-phase first output clock signals.

BRIEF DESCRIPTION OF THE DRAWINGS

The application will become more fully understood by referring to the following detailed description with reference to the accompanying drawings, wherein.

DETAILED DESCRIPTION

The following description is of the preferred embodiments of carrying out the application. The scope of the application is best determined by reference to the appended claims.

Figure 1:
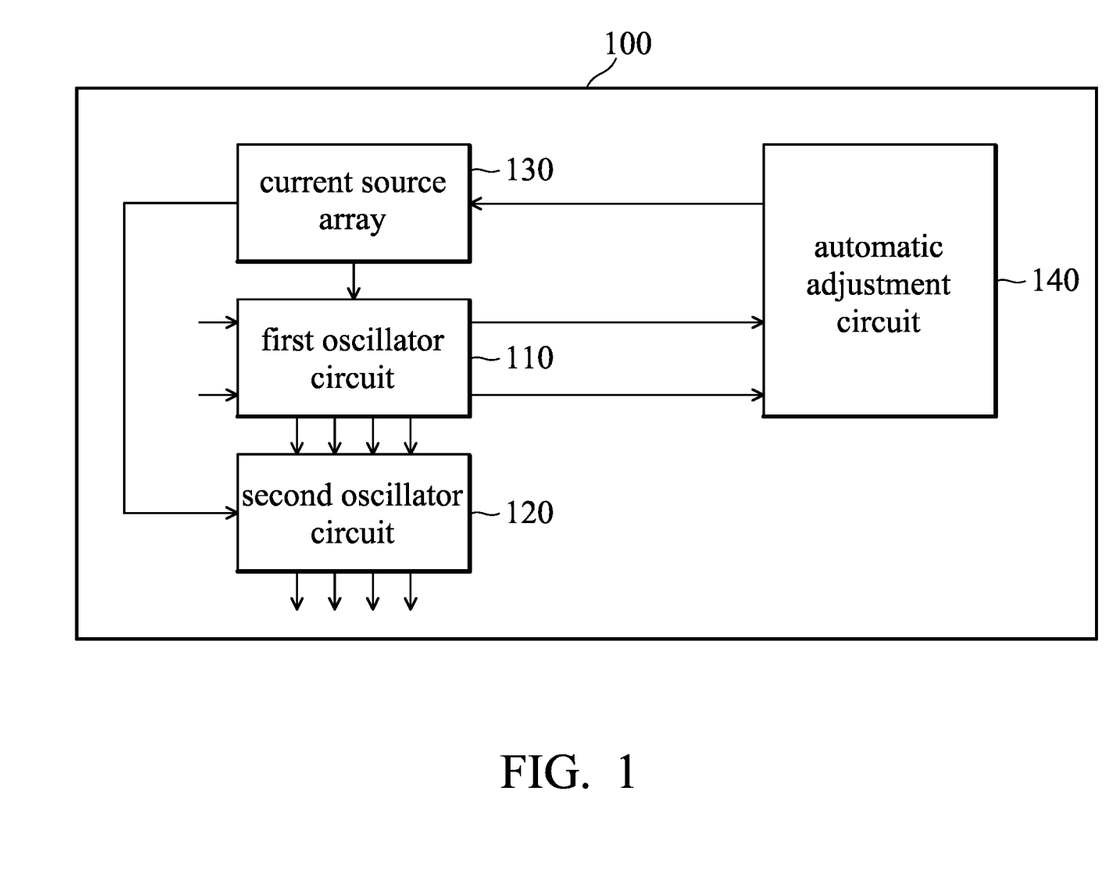
FIG. 1 is a block diagram of a multi-phase clock generator 100 according to an embodiment of the application.

FIG. 1 is a block diagram of a multi-phase clock generator 100 according to an embodiment of the application. As shown in FIG. 1, the multi-phase clock generator 100 may comprise a first oscillator circuit 110, a second oscillator circuit 120, a current source array 130 and an automatic adjustment circuit 140. It should be noted that FIG. 1 presents a simplified block diagram in which only the elements relevant to the application are shown. However, the application should not be limited to what is shown in FIG. 1. The multi-phase clock generator 100 may also comprise other elements.

Figure 2:
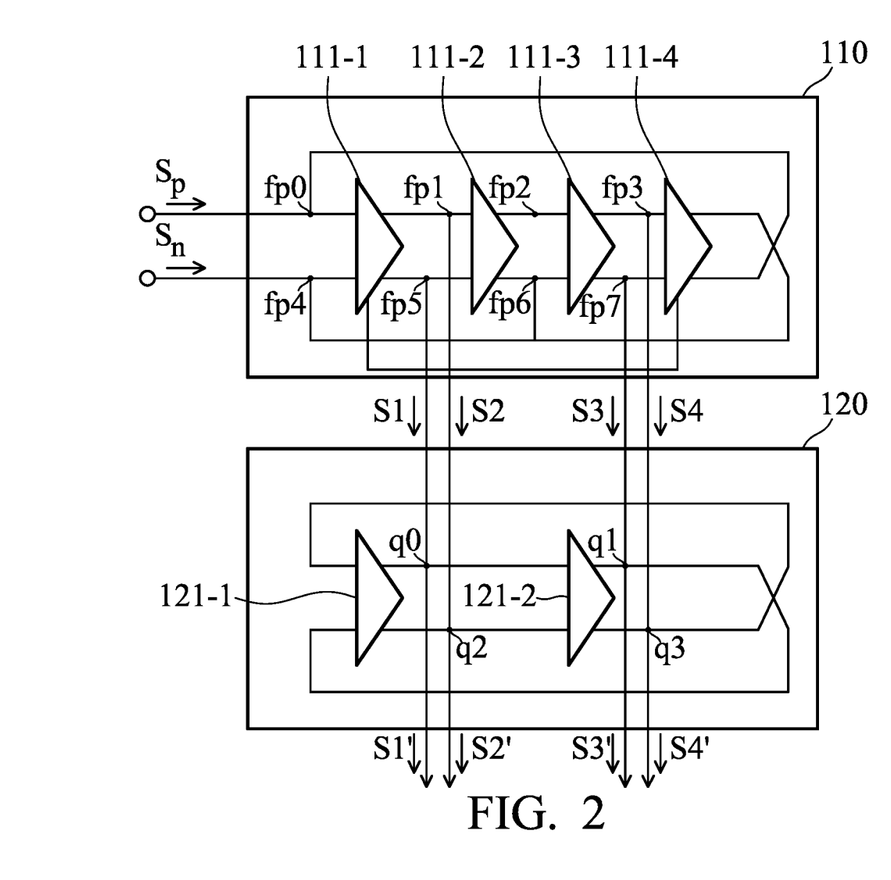
FIG. 2 is a circuit diagram of the first oscillator circuit 110 and the second oscillator circuit 120 according to an embodiment of the application.

According to the embodiments of the application, the first oscillator circuit 110 is configured to receive multi-phase input clock signals with the same frequency. The second oscillator circuit 120 is configured to output multi-phase output clock signals with the same frequency, wherein the number of output clock signals is greater than the number of input clock signals. FIG. 2 is taken as an example below.

FIG. 2 is a circuit diagram of the first oscillator circuit 110 and the second oscillator circuit 120 according to an embodiment of the application. As shown in FIG. 2, according to the embodiments of the application, the first oscillator circuit 110 comprises first delay circuits 111-1~111-4 and output nodes fp0~fp7. The second oscillator circuit 120 comprises second delay circuits 121-1 and 121-2 and the output nodes q0~q3. The output nodes fp1, fp3, fp5 and fp7 of the first oscillator circuit 110 are respectively coupled to the output nodes q0, q1, q2, q3 of the second oscillator circuit 120.

As shown in FIG. 2, when the output nodes fp0 and fp4 of the first oscillator circuit 110 receive the input clock signals Sp and Sn with the same frequency Freq_m1 and different phases (the input clock signals Sp and Sn may be from a voltage control circuit (not shown in figures)) and the frequency Freq_m1 is in the current oscillation frequency range [freq_L1, freq_H1] of the first oscillator circuit 110 and the second oscillator circuit 120, the first oscillator circuit 110 may generate the first output clock signals S1, S2 S3 and S4 at the output nodes fp1, fp3, fp5 and fp7 respectively based on the input clock signals Sp and Sn, wherein the first output clock signals S1, S2 S3 and S4 have the same frequency Freq_m1 and different phases. In the embodiment, the input clock signals Sp and Sn may be a pair of differential clock signals with the same frequency (i.e., Freq_m1). In the embodiment, the first oscillator circuit 110 may generate 4-phase first output clock signals S1, S2 S3 and S4 based on 2-phase input clock signals Sp and Sn. In addition, it should be noted that the clock signals also generated at the output nodes fp2 and fp6, but in order to maintain the uniformity of the output clock signals, the clock signals at the output nodes fp2 and fp6 are not transmitted to the second oscillator circuit 120.

In addition, because the input clock signals Sp and Sn are only input to the output nodes fp0 and fp4, the phase differences between the adjacent clock signals of the first output clock signals S1, S2 S3 and S4 are not equal, and the first oscillator circuit 110 may respectively output first output clock signals S1, S2 S3 and S4 from output nodes fp5, fp1, fp7 and fp3 to output nodes q0, q2, q1, q3 of the second oscillator circuit 120. This is done to adjust the phase differences between any two adjacent ones of the first output clock signals S1, S2 S3 and S4 to the same phase difference.

The second oscillator circuit 120 may respectively generate multi-phase second output clock signals S1', S2' S3' and S4' based on the first output clock signals S1, S2 S3 and S4 and output the multi-phase second output clock signals S1', S2' S3' and S4' from the output nodes q0, q2, q1, q3. The multi-phase second output clock signals S1', S2' S3' and S4' may regarded as the output clock signals of the multi-phase clock generator 100. The multi-phase second output clock signals S1', S2' S3' and S4' have the same frequency and uniform phases (i.e., 4-phase). In the embodiment, the uniform phases mean that the phase difference between the adjacent clock signals of the output clock signals is a fixed value. Taking FIG. 2 as an example, the phase difference between the adjacent clock signals of the multi-phase second output clock signals S1', S2' S3' and S4' is 90 degree.

In addition, it should be noted that the first oscillator circuit 110 and the second oscillator circuit 120 shown in FIG. 2 are only used to illustrate the embodiments of the application, but the application should not be limited thereto. The first oscillator circuit 110 and the second oscillator circuit 120 may comprise other number (more than two) of delay circuits.

Figure 3:
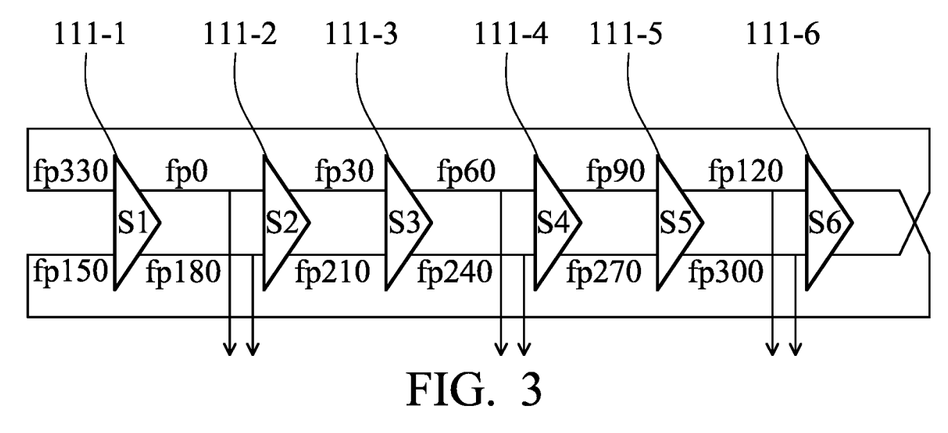
FIG. 3 is a circuit diagram of the first oscillator circuit 110 according to another embodiment of the application.
Figure 4:
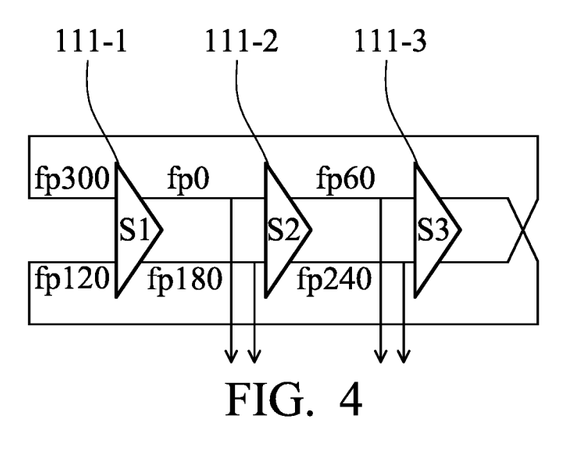
FIG. 4 is a circuit diagram of the first oscillator circuit 110 according to another embodiment of the application.

Specifically, in some embodiments, the first oscillator circuit 110 may comprise even number of first delay circuits. For example, as shown in FIG. 3, the first oscillator circuit 110 may comprise 6 first delay circuits 111-1~111-6 and the second oscillator circuit 120 may comprise 3 second delay circuits (not shown in FIG. 3). In some embodiments, the first oscillator circuit 110 may also comprise odd number of first delay circuits. For example, as shown in FIG. 4, the first oscillator circuit 110 may comprise 3 first delay circuits and the second oscillator circuit 120 may comprise 2 second delay circuits (as shown in FIG. 2).

Figure 5:
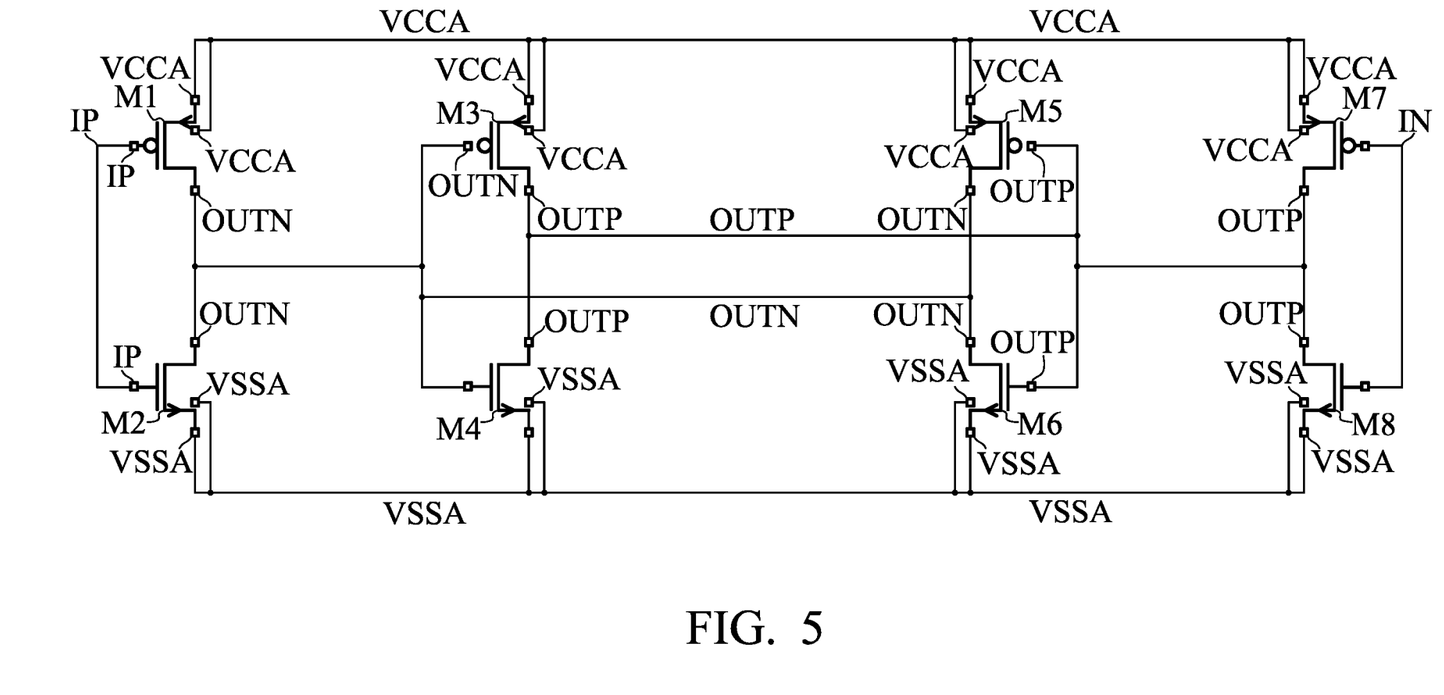
FIG. 5 is a circuit diagram of the delay circuit according to an embodiment of the application.

FIG. 5 is a circuit diagram of the delay circuits according to an embodiment of the application. The delay circuit shown in FIG. 5 may be applied to any delay circuit of the first oscillator circuit 110 and the second oscillator circuit 120. As shown in FIG. 5, the delay circuit may comprise a first transistor M1, a second transistor M2, a third transistor M3, a fourth transistor M4, a fifth transistor M5, a sixth transistor M6, a seventh transistor M7 and an eighth transistor M8. The first transistor M1, the third transistor M3, the fifth transistor M5 and the seventh transistor M7 are P-type transistors. The second transistor M2, the fourth transistor M4, the sixth transistor M6 and the eighth transistor M8 are N-type transistors. The first transistor M1 and the second transistor M2 are combined to be a first inverter 510. The seventh transistor M7 and the eighth transistor M8 are combined to be a second inverter 520. The third transistor M3, the fourth transistor M4, the fifth transistor M5 and the sixth transistor M6 are combined to be a latch 530.

According to the embodiments of the application, the sizes of the transistors in the inverter structure (e.g., the first inverter 510 and/or the second inverter 520) may be larger than the sizes of the transistors in the latch structure (e.g., the latch 530). For example, the sizes of the transistors in the inverter structure (e.g., the first inverter 510 and/or the second inverter 520) may be two times larger than the sizes of the transistors in the latch structure, but the application should not be limited thereto. In the embodiment, the size of the transistor may be aspect ratio of the transistor, but the application should not be limited thereto. The input signals IP and IN may be a pair of differential signals, and the output signals OUTP and OUTN may also be a pair of differential signals. The VCCA is source voltage and the VSSA is ground voltage.

When the input signal IP is high, the first transistor M1 is disabled, the second transistor M2 is enabled and the output signal OUTN is pulled to low. Because the input signals IP and IN are a pair of differential signals, when the input signal IN is low, the seventh transistor M7 is enabled, the eighth transistor M8 is disabled and the output signal OUTP is pulled to high. When the output signal OUTP is high and the output signal OUTN is low, the third transistor M3 is enabled, the fourth transistor M4 is disabled, the fifth transistor M5 is disabled and the sixth transistor M6 is enabled. When the input signal IP is changed from high to low and the input signal IN is changed from low to high, the first transistor M1, the eighth transistor M8, the fourth transistor M4 and the fifth transistor M5 are enabled, and the second transistor M2, the seventh transistor M7, the third transistor M3 and the sixth transistor M6 are disabled. In addition, the output signal OUTN is changed from low to high and the output signal OUTP is changed from high to low. The above operations may be regarded as one signal reverse. The delay time of the delay circuit may be the time from the falling edge (rising edge) of the input signal IP to the falling edge (rising edge) of the output signal OUTP.

According to the embodiments of the application, the current source array 130 is configured to provide a current to the first oscillator circuit 110 and the second oscillator circuit 120. Generally speaking, the current source array 130 may generate a suitable current to make the first oscillator circuit 110 and the second oscillator circuit 120 operate in an oscillation frequency range [freq_L, freq_H]. The oscillation frequency range [freq_L, freq_H] corresponding to the first oscillator circuit 110 and the second oscillator circuit 120 may be changed based on the current generated by the current source array 130. Taking 32-bit current source array 130 as an example, 32-bit current source array 130 may provide 32 different sizes of currents to the first oscillator circuit 110 and the second oscillator circuit 120 to make sure the first oscillator circuit 110 and the second oscillator circuit 120 may operate in different oscillation frequency ranges [freq_L (1:32), freq_H (1:32)]. It should be noted that the application is not limited to the 32-bit current source array 130. The bits of the current source array 130 may be adjusted based on the user's requirements.

Figure 6:
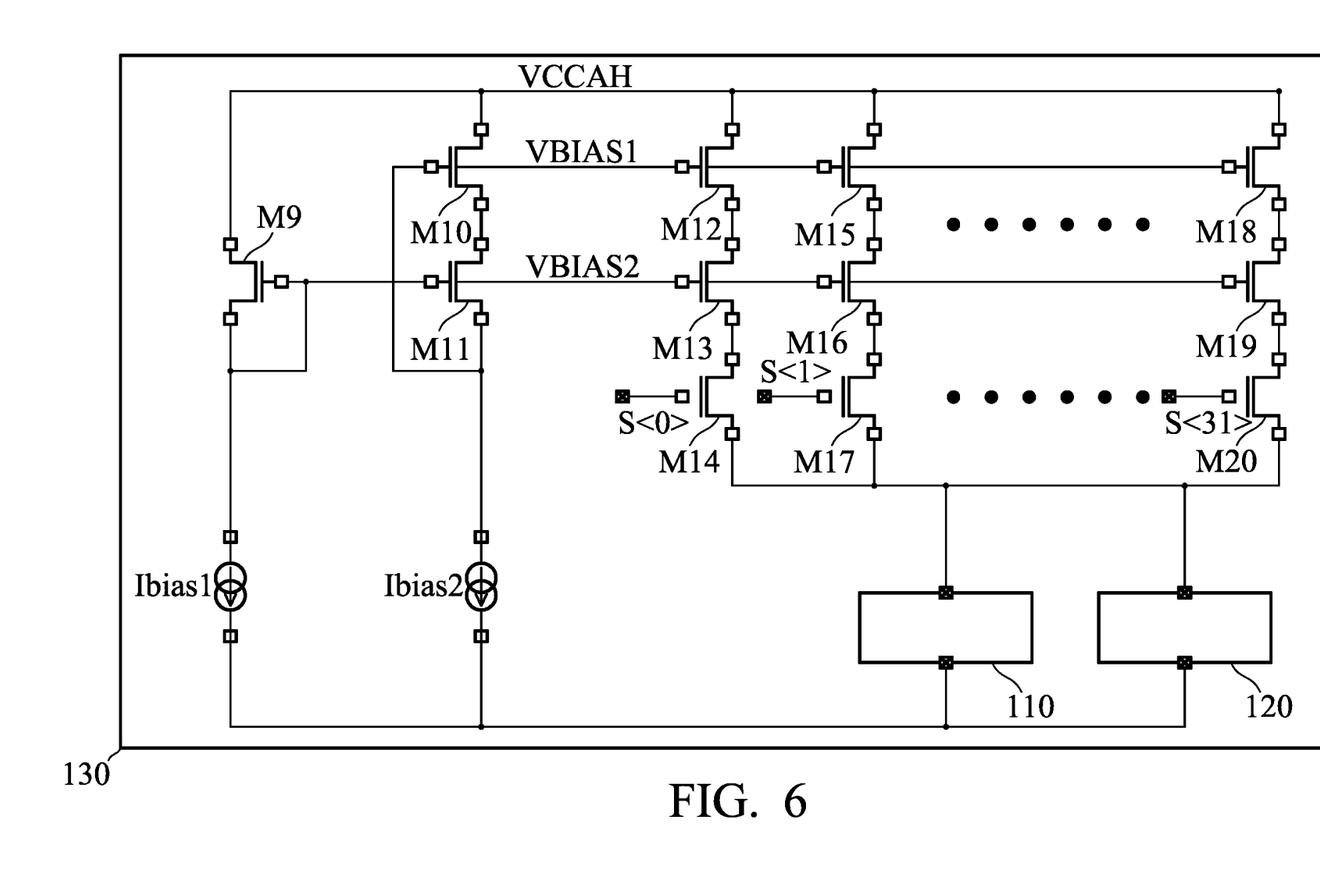
FIG. 6 is a circuit diagram of 32-bit current source array 130 according to an embodiment of the application.

FIG. 6 is a circuit diagram of 32-bit current source array 130 according to an embodiment of the application. As shown in FIG. 6, the current source array 130 comprises a ninth transistor M9, a tenth transistor M10, an eleventh transistor M11 and 32 groups of current source switch circuits, wherein the first group of current source switch circuit comprises a twelfth transistor M12, a thirteenth transistor M13 and a fourteenth transistor M14, the second group of current source switch circuit comprises a fifteenth transistor M15, a sixteenth transistor M16 and a seventeenth transistor M17 . . . and the thirty-second group of current source switch circuit comprises an eighteenth transistor M18, nineteenth transistor M19 and the twentieth transistor M20. Ibias1 and Ibias2 are the bias currents provided externally. The VBIAS1 and VBIAS2 are bias voltages. It should be noted that the circuit diagram shown in FIG. 6 is only used to illustrate the embodiments of the application, but the application should not be limited thereto.

As shown in FIG. 6, the ninth transistor M9, the tenth transistor M10 and the eleventh transistor M11 may generate bias voltages VBIAS1 and VBIAS2 based on the bias currents Ibias1 and Ibias2. In addition, the twelfth transistor M12 and the thirteenth transistor M13 of the first group of current source switch circuit are used to provide the current to the first oscillator circuit 110 and the second oscillator circuit 120. The fourteenth transistor M14 of the first group of current source switch circuit is a switch of the first group of the current source switch circuit. The fourteenth transistor M14 may receive the control signal S<0> from the automatic adjustment circuit 140. Accordingly, the fifteenth transistor M15 and the sixteenth transistor M16 of the second group of current source switch circuit are used to provide the current to the first oscillator circuit 110 and the second oscillator circuit 120. The seventeenth transistor M17 of the second group of current source switch circuit is a switch of the second group of current source switch circuit. The seventeenth transistor M17 may receive the control signal S<1> from the automatic adjustment circuit 140. The eighteenth transistor M18 and the nineteenth transistor M19 of the thirty-second group of current source switch circuit are used to provide the current to the first oscillator circuit 110 and the second oscillator circuit 120. The twentieth transistor M20 of the thirty-second group of current source switch circuit is a switch of the thirty-second group of current source switch circuit. The twentieth transistor M20 may receive the control signal S<31> from the automatic adjustment circuit 140. Taking the first group of current source switch circuits as an example, when the control signal S<0> is high, the first group of current source switch circuit is disable; and when the control signal S<0> is low, the first group of current source switch circuits is enable to provide the current to the first oscillator circuit 110 and the second oscillator circuit 120.

When the control signal S<0> is low and other control signals S<1:31> are high, only the first group of current source switch circuit is used to provide current to the first oscillator circuit 110 and the second oscillator circuit 120. Then, if the oscillation frequencies of the first oscillator circuit 110 and the second oscillator circuit 120 are lower than the frequency range of the input signal, the automatic adjustment circuit 140 may adjust the control signal S<1> from high to low to enable the second group of current source switch circuit. Then, the first group of current source switch circuit and the second group of current source switch circuit may provide current to the first oscillator circuit 110 and the second oscillator circuit 120 at the same time to increase the oscillation frequencies of the first oscillator circuit 110 and the second oscillator circuit 120. Accordingly, based on the oscillation frequencies of the first oscillator circuit 110 and the second oscillator circuit 120, the automatic adjustment circuit 140 may determine whether to enable another group of the current source switch circuit or disable the group of current source switch circuit which has been enabled. When the current of the current source array 130 is adjusted, the frequency range corresponding to the first oscillator circuit 110 and the second oscillator circuit 120 will be changed.

According to the embodiments of the application, in order to compensate the process, voltage and temperature (PVT) affection in the first oscillator circuit 110 and the second oscillator circuit 120, the automatic adjustment circuit 140 may determine whether to adjust the current of the current source array 130 based on a reference clock signal refclk and a feedback signal Fosc from the first oscillator circuit 110 to adjust the oscillation frequency of the feedback signal Fosc. The feedback signal Fosc may be one of the first output clock signals and the reference clock signal refclk may be one of the multi-phase input clock signals with the same frequency received by the first oscillator circuit 110. The reference clock signal refclk may be transmitted to the automatic adjustment circuit 140 through the first oscillator circuit 110 or transmitted to the automatic adjustment circuit 140 directly.

According to another embodiment of the application, the feedback signal Fosc may be a pair of differential signals of the first output clock signals and the reference clock signal refclk may be a pair of differential signals of the multi-phase input clock signals with the same frequency received by the first oscillator circuit 110. The reference clock signal refclk may be transmitted to the automatic adjustment circuit 140 through the first oscillator circuit 110 or transmitted to the automatic adjustment circuit 140 directly.

According to another embodiment of the application, the feedback signal Fosc may be one or a pair of differential signals of the first output clock signals and the reference clock signal refclk may be one or a pair of differential signals of the multi-phase input clock signals with the same frequency received by the first oscillator circuit 110. The reference clock signal refclk may be transmitted to the automatic adjustment circuit 140 through other circuits.

Figure 7:
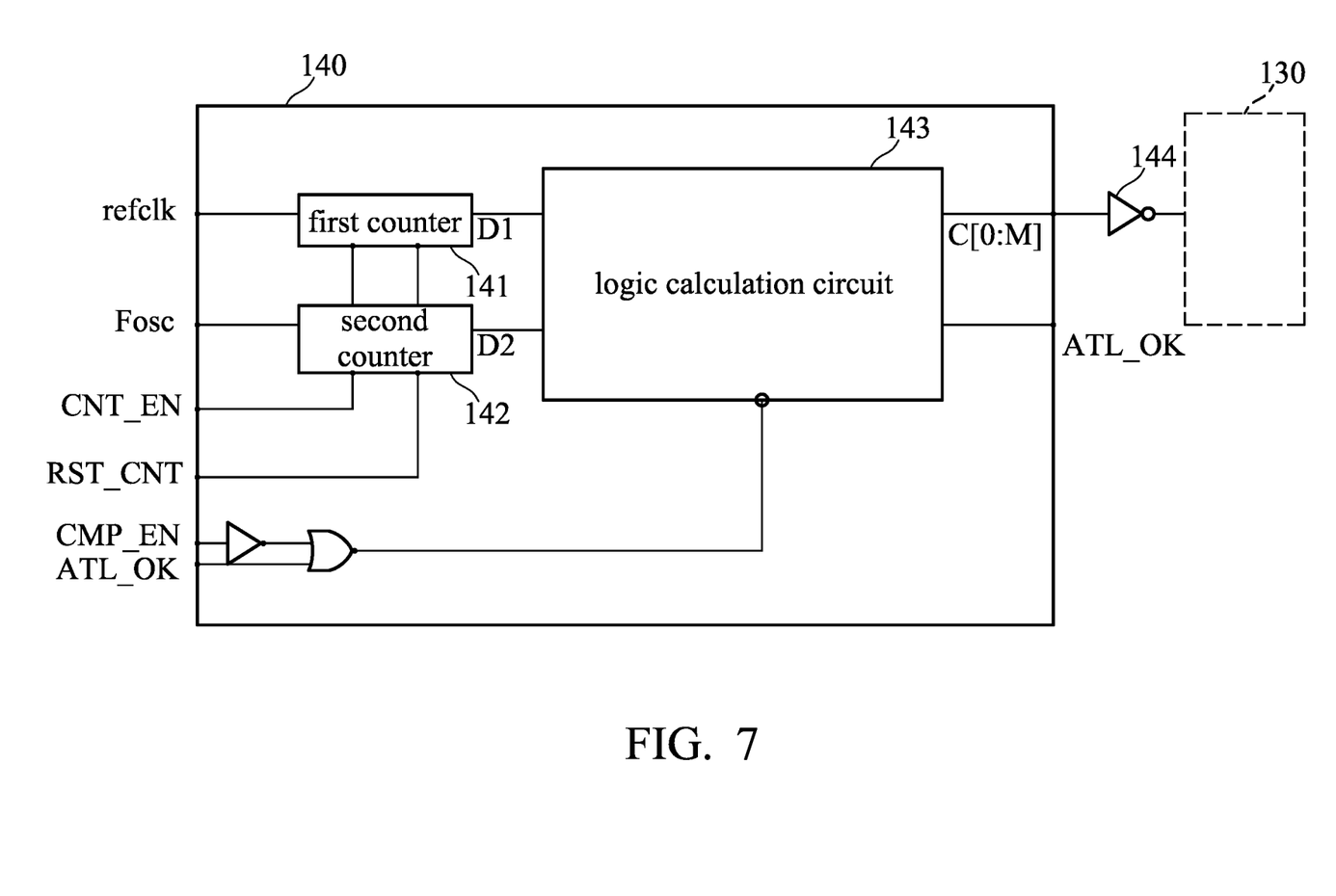
FIG. 7 is a circuit diagram of the automatic adjustment circuit 140 according to an embodiment of the application.

Generally speaking, the oscillation frequency of the feedback signal Fosc may correspond to the oscillation frequency range of the first oscillator circuit 110 and the second oscillator circuit 120. FIG. 7 is taken as an example for illustration below.

FIG. 7 is a circuit diagram of the automatic adjustment circuit 140 according to an embodiment of the application. As shown in FIG. 7, the automatic adjustment circuit 140 may comprise a first counter 141, a second counter 142 and a logic calculation circuit 143. The first counter 141 may receive the reference clock signal refclk. The first counter 141 may generate a first count value D1 based on the reference clock signal refclk, and transmit the first count value D1 to the logic calculation circuit 143. The second counter 142 may receive the feedback signal Fosc from the first oscillator circuit 110. The second counter 142 may generate a second count value D2 based on the feedback signal Fosc, and transmit the second count value D2 to the logic calculation circuit 143.

The logic calculation circuit 143 may compare the first count value D1 with the second count value D2 to generate adjustment signals C[0:M]. The adjustment signals C[0:M] may be processed by the inverter 144 to generate the control signals S<0>~S<M>, and the control signals S<0>~S<M> may be transmitted to the respective groups of the current source switch circuits of the current source array 130. For example, if the current source array 130 is 32-bit, the adjustment signals C[0:31] may be processed by the inverter 144 to generate the control signals S<0>~S<31>, and the control signals S<0>~S<31> may be respectively transmitted to the first group of current source switch circuits a thirty-second group of current source switch circuits of the current source array 130.

According to the embodiments of the application, when the first count value D1 is the same as the second count value D2, the logic calculation circuit 143 may maintain the values of the adjustment signals C[0:M] to maintain the stability of the current provided to the first oscillator circuit 110 and the second oscillator circuit 120 by the current source array 130. According to another embodiment of the application, when the first count value D1 is larger than the second count value D2, the logic calculation circuit 143 may increase the values of the adjustment signals C[0:M] to increase the current provided to the first oscillator circuit 110 and the second oscillator circuit 120 by the current source array 130. When the first count value D1 is smaller than the second count value D2, the logic calculation circuit 143 may decrease the values of the adjustment signals C[0:M] to decrease the current provided to the first oscillator circuit 110 and the second oscillator circuit 120 by the current source array 130.

Figure 8:
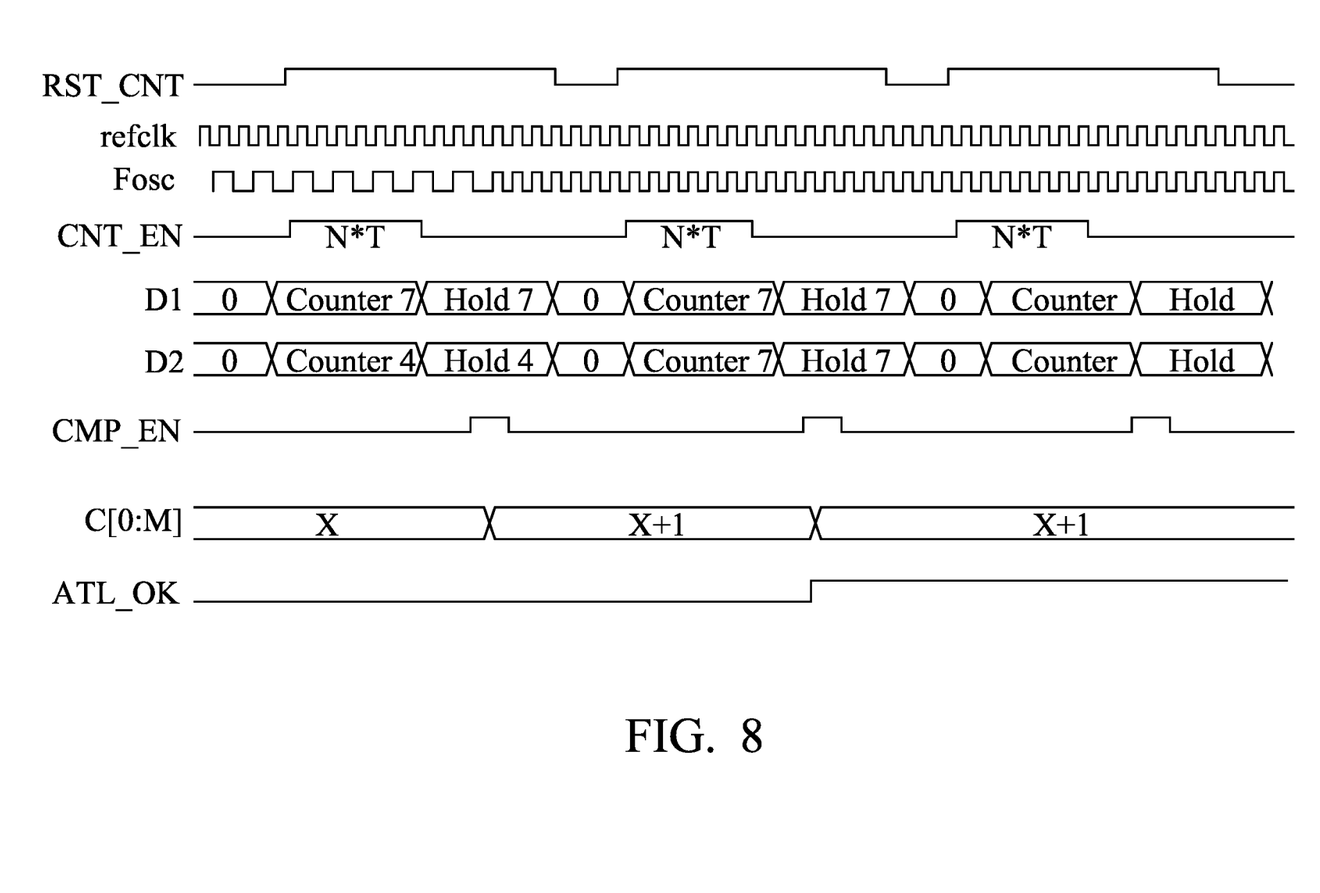
FIG. 8 is a timing diagram of the automatic adjustment circuit 140 according to an embodiment of the application.

FIG. 8 is a timing diagram of the automatic adjustment circuit 140 according to an embodiment of the application. As shown in FIG. 8, in the initial state, the value of the counter enable signal RST_CNT, the value of the count period CNT_EN, the first count value D1 and the second count value D2 are 0, and the value of adjustment signals C[0:M] is set to X. X is a medium value, e.g. if the current source array 130 comprises 32 groups of current source switch circuits, the X may be set to 16. When the value of the counter enable signal RST_CNT is changed from low to high, the value of the count period CNT_EN is also changed from low to high. The first counter 141 starts to count the rising edge of the reference clock signal refclk from 0 to generate the first count value D1, e.g. the first count value D1 may be 7 presented by Counter 7 in FIG. 8. The second counter 142 starts to count the number of the rising edge of the feedback signal Fosc from 0 to generate the second count value D2, e.g. the second count value D2 may be 4 presented by Counter 4 in FIG. 8. After a cycle time (i.e., after N clock cycle T of reference clock signal refclk, i.e., N*T), the value of the count period CNT_EN is changed to low, and the first count value D1 and the second count value D2 may hold the same values (presented by Hold7 and Hold4 in FIG. 8). Then, the comparison enable signal CMP_EN is changed from low to high, and therefore, the automatic adjustment circuit 140 starts to compare the first count value D1 with the second count value D2. Because the first count value D1 is larger than the second count value D2, the automatic adjustment circuit 140 may adjust the value of adjustment signals C[0:M] from X to X+1 to increase the current generated by the current source array 130. Therefore, the oscillation frequency of the feedback signal Fosc will be increased. The above operations show a complete current adjustment. Then, the above operations will be repeated again. If the first count value D1 is equal to the second count value D2, the automatic adjustment circuit 140 may maintain the value of adjustment signals C[0:M] (e.g., maintain at X+1). In addition, when the adjustment complete signal ATL_OK is changed from low to high, which means that the automatic adjustment circuit 140 has completed the adjustments.

Figure 9:
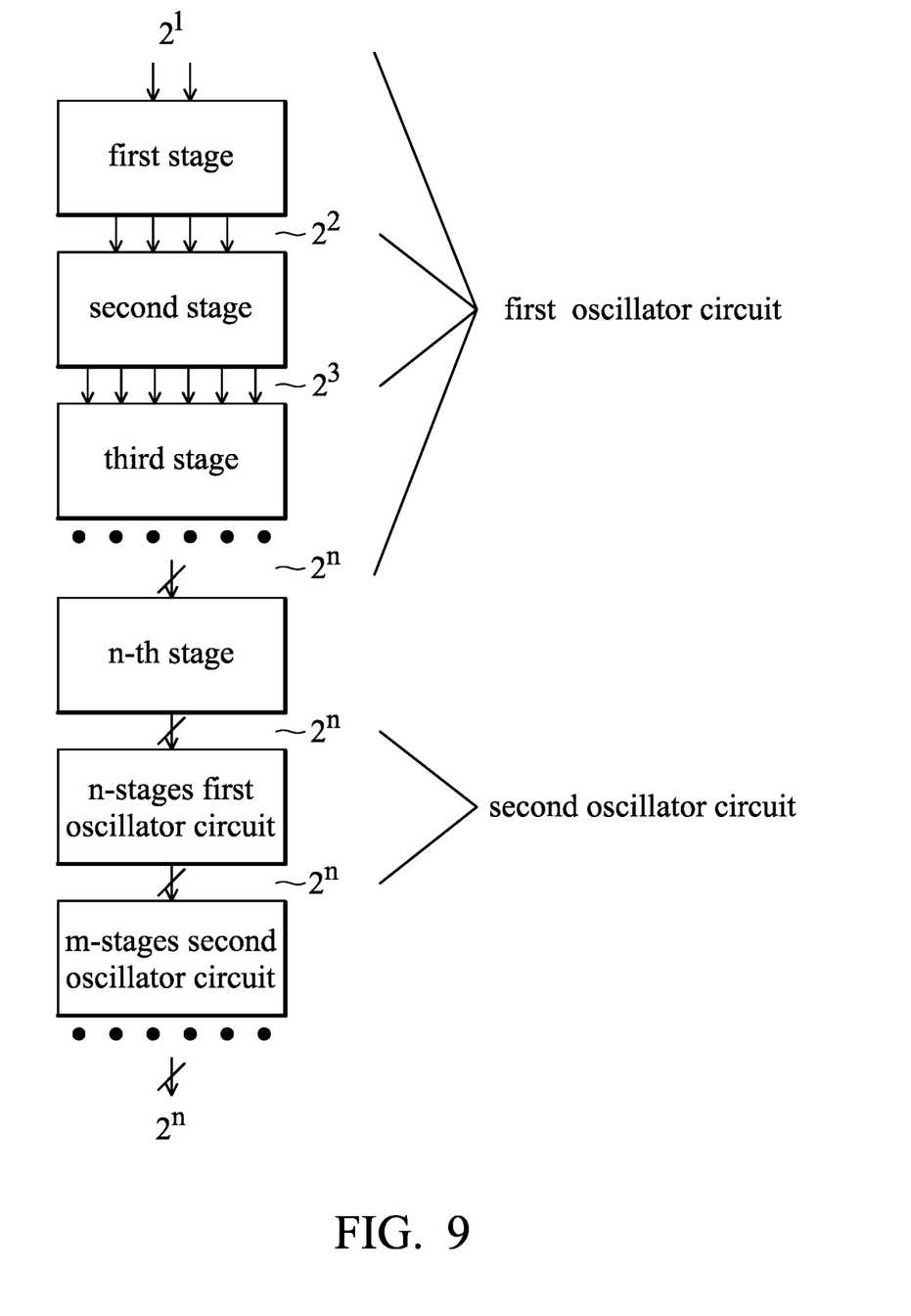
FIG. 9 is a schematic diagram of multi-stage oscillator circuits according to an embodiment of the application.

According to the embodiments of the application, the number of stages of the first oscillator circuit 110 or the second oscillator circuit 120 in the multi-phase clock generator 100 may not be limited to one. FIG. 9 is a schematic diagram of multi-stage oscillator circuits according to an embodiment of the application. As shown in FIG. 9, the multi-phase clock generator 100 may comprise a n-stages first oscillator circuit 110 and a m-stages second oscillator circuit 120. The n-stages first oscillator circuit 110 may be used to generate $2^n$ first output clocks based on $2^1$ input clocks, and the m-stages second oscillator circuit 120 may be used to adjust the phases of the $2^n$ first output clocks to generate $2^n$ second output clocks with uniform phases.

Specifically, the first stage of the first oscillator circuit 110 may receive a pair ($2^1$) of differential clocks with the first frequency and output 4 clocks and the second stage of the first oscillator circuit 110 may receive the output of the first stage of the first oscillator circuit 110 and output 8 clocks. Accordingly, the n-th stage of the first oscillator circuit 110 may receive the $2^{n-1}$ output clocks of the (n−1)-th stage of the first oscillator circuit 110 and output $2^n$ clocks. The $2^n$ clocks may have the same frequency as the input clocks. Therefore, multi-phase clocks with the same frequency will be generated without performing any frequency division operation. In the embodiment, multi-phase clocks mean that different clock may correspond to different phase.

In addition, the phases of the 2n output clocks from the first oscillator circuit 110 are not uniform. Therefore, the 2n output clocks from the first oscillator circuit 110 need to be input to the m-stages second oscillator circuit 120. The phases of the output clocks of the first stage of the second oscillator circuit 120 have higher linearity than the phases of the output clocks of the n-th stage of the first oscillator circuit 110. That is to say, each stage of the second oscillator circuit 120 may not increase the number of the phase of the output clocks. Each stage of the second oscillator circuit 120 is used to adjust the linearity of the phases of the clocks. Therefore, the number of output clocks of each stage of the second oscillator circuit 120 is the same. When the higher stage numbers the second oscillator circuit has, the more linearity the clock phases will be higher. Therefore, the second oscillator circuit 120 may output $2^n$ output clocks with uniform phases and the same frequency. In the embodiment, adjusting the linearity of the phases of the clocks means that the phase difference between adjacent clocks tends to equal.

According to another embodiment of the application, the n-stages first oscillator circuit 110 may be used to generate $2^{i+n-1}$ first output clocks based on $2^i$ input clocks, and the m-stages second oscillator circuit 120 may be used to adjust the linearity of the phases of the $2^{i+n-1}$ first output clocks to generate $2^{i+n-1}$ second output clocks with uniform phases, wherein i is a positive integer, and n is a positive integer larger than i.

Figure 10:
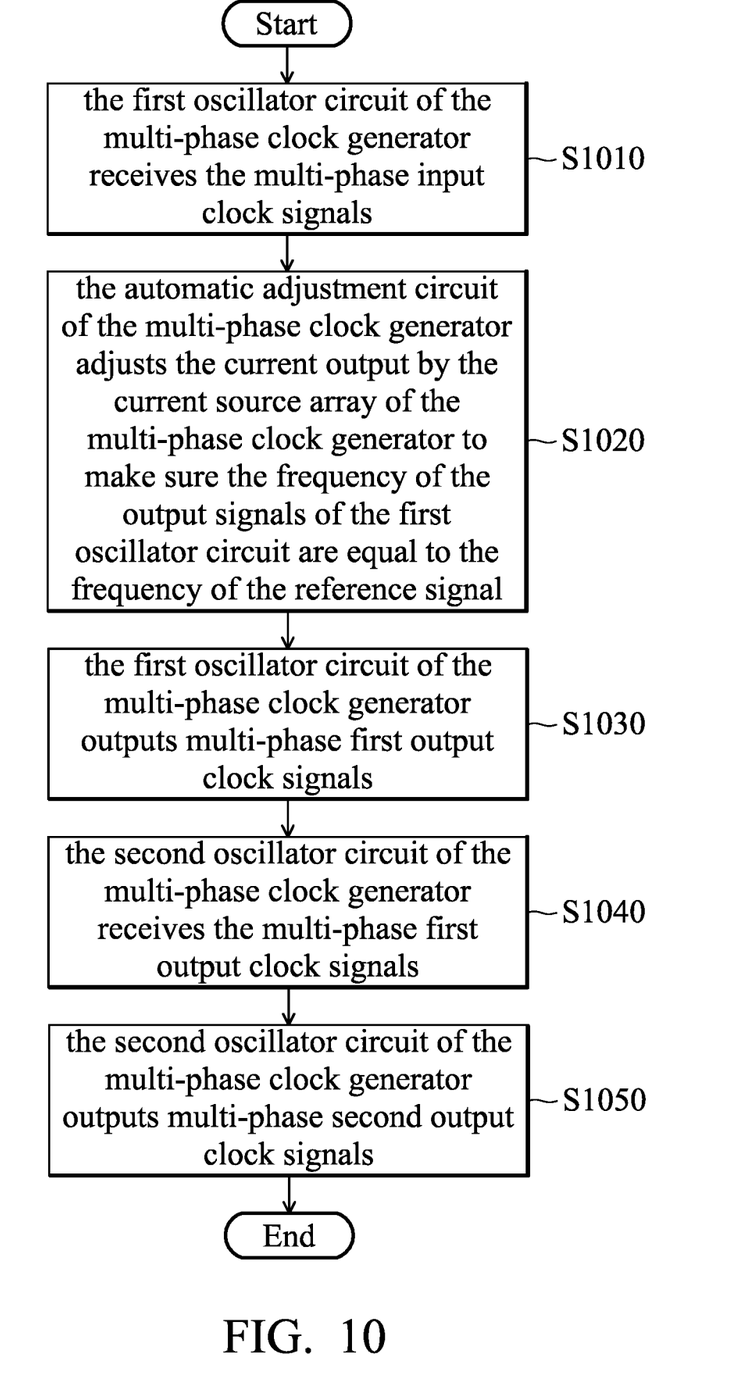
FIG. 10 is a flow chart illustrating a multi-phase clock-generating method according to an embodiment of the application.

According to another embodiment of the application, As shown in FIG. 9, the last j stages of the n-stages first oscillator circuit 110 and the first k stages of the m-stages second oscillator circuit 120 may be selected as the multi-phase clock generator of the application to perform the embodiments of the application, wherein j and k are positive integers FIG. 10 is a flow chart illustrating a multi-phase clock-generating method according to an embodiment of the application. The multi-phase clock-generating method may be applied to the multi-phase clock generator 100. As shown in FIG. 10, in step S1010, the first oscillator circuit of the multi-phase clock generator 100 receives the multi-phase input clock signals, wherein the first oscillator circuit comprises a plurality of first delay circuits.

In step S1020, the automatic adjustment circuit of the multi-phase clock generator 100 adjusts the current output by the current source array of the multi-phase clock generator 100 to make sure the frequency of the output signals of the first oscillator circuit is equal to the frequency of the reference signal.

In step S1030, the first oscillator circuit of the multi-phase clock generator 100 outputs multi-phase first output clock signals, wherein the number of multi-phase first output clock signals is greater than the number of multi-phase input clock signals.

In step S1040, the second oscillator circuit of the multi-phase clock generator 100 receives the multi-phase first output clock signals, wherein the second oscillator circuit comprises a plurality of second delay circuits.

In step S1050, the second oscillator circuit of the multi-phase clock generator 100 outputs multi-phase second output clock signals, wherein the number of second delay circuits is less than the number of first delay circuits, and the number of multi-phase second output clock signals is the same as the number of multi-phase first output clock signals.

According to the embodiments of the application, in the multi-phase clock-generating method, the first oscillator circuit comprises a plurality of first output nodes and the second oscillator circuit comprises a plurality of second output nodes, wherein the output nodes of the plurality of first output nodes which are used to output the multi-phase first output clock signals are coupled to the respective second output nodes.

According to an embodiment of the application, in the multi-phase clock-generating method, the number of first delay circuits is an odd value. According to another embodiment of the application, in the multi-phase clock-generating method, the number of first delay circuits is an even value.

According to an embodiment of the application, in the multi-phase clock-generating method, the current source array of the multi-phase clock generator 100 provides the current to the first oscillator circuit and the second oscillator circuit to make the first oscillator circuit and the second oscillator circuit operate in a fixed frequency range. When the current provided by the current source array of the multi-phase clock generator 100 is adjusted, the frequency range corresponding to the first oscillator circuit and the second oscillator circuit will be adjusted accordingly.

According to an embodiment of the application, in the multi-phase clock-generating method, the automatic adjustment circuit of the multi-phase clock generator 100 receives the feedback signal from the first oscillator circuit and a reference clock signal and compares the feedback signal with the reference clock signal to adjust the current output by the current source array.

According to an embodiment of the application, in the multi-phase clock-generating method, the automatic adjustment circuit of the multi-phase clock generator 100 determines whether the first frequency of the reference clock signal is the same as the second frequency of the feedback signal, wherein the multi-phase input clock signals also have first frequency. When the first frequency is different from the second frequency, the automatic adjustment circuit of the multi-phase clock generator 100 outputs an adjustment signal to the current source array to adjust the current output by the current source array.

According to the multi-phase clock-generating method provided in the application, the front-end voltage controlled oscillator (VCO), e.g., inductor-capacitor VCO, may only need to output 2-phase clock signals to the multi-phase clock generator of the application. That is to say, in the multi-phase clock-generating method provided in the application, the multi-phase clock generator may generate multi-phase clock signals, e.g., 4-phase output clock signals, only based on the 2-phase clock signals from the front-end VCO. Therefore, in the multi-phase clock-generating method provided in the application, the data transmission rate may be increased without increasing the oscillation frequency of the front-end VCO and dividing the increased oscillation frequency.

In addition, according to the multi-phase clock-generating method provided in the application, the multi-phase clock generator may generate high-precision multi-phase clock signals (e.g., 4-phase, 8-phase, and so on) based on the 2-phase input clock signals to each lane. Therefore, the phase skew problem will be resolved.

Figure 11:
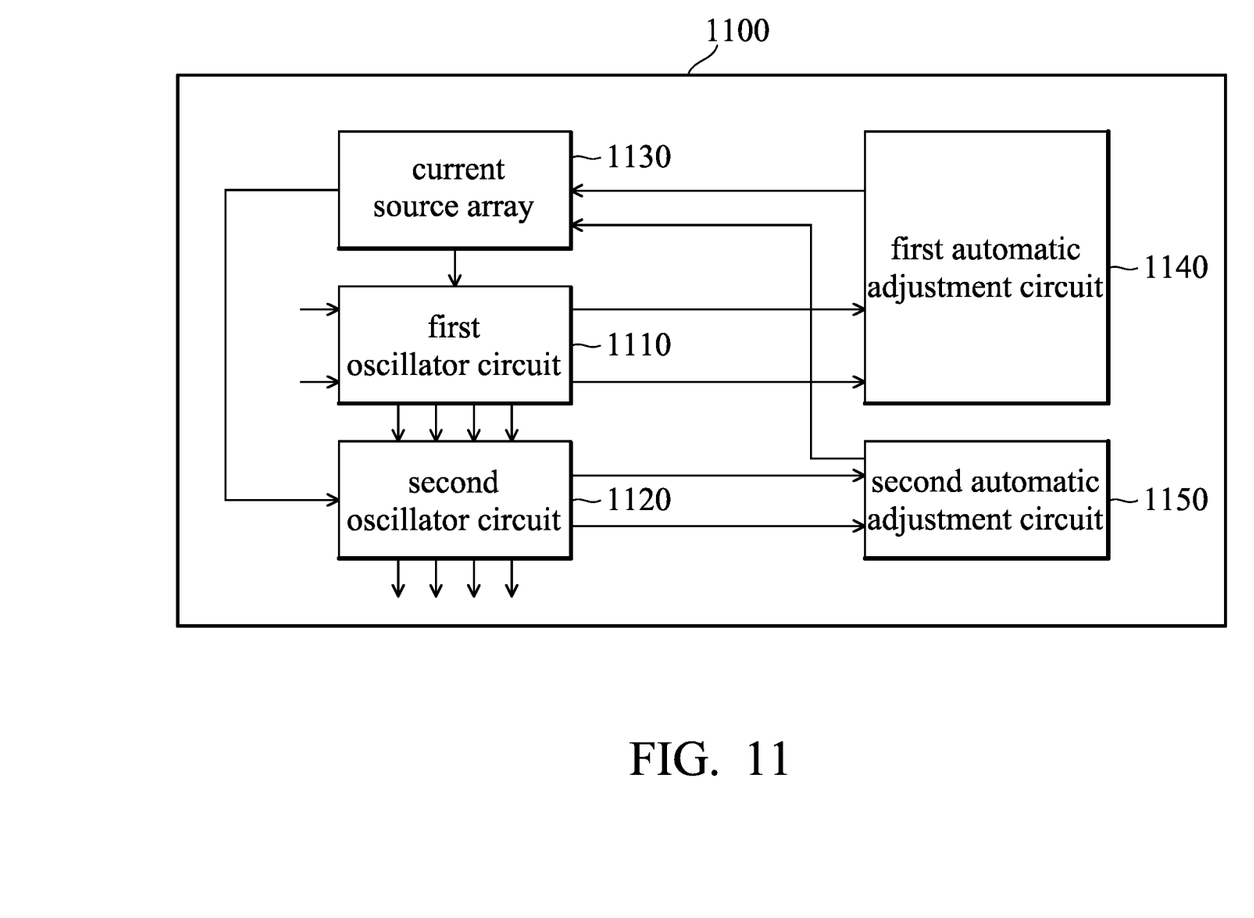
FIG. 11 is a block diagram of a multi-phase clock generator 1100 according to another embodiment of the application.

FIG. 11 is a block diagram of a multi-phase clock generator 1100 according to another embodiment of the application. As shown in FIG. 11, the multi-phase clock generator 1100 may comprise a first oscillator circuit 1110, a second oscillator circuit 1120, a current source array 1130, a first automatic adjustment circuit 1140 and a second automatic adjustment circuit 1150. It should be noted that FIG. 11 presents a simplified block diagram in which only the elements relevant to the application are shown. However, the application should not be limited to what is shown in FIG. 11. The above operations and structure of the first oscillator circuit 110 may be applied to the first oscillator circuit 1110 of FIG. 11. The above operations and structure of the second oscillator circuit 120 may be applied to the second oscillator circuit 1120 of FIG. 11. The above operations and structure of the current source array 130 may be applied to the current source array 1130 of FIG. 11. The above operations and structure of the automatic adjustment circuit 140 may be applied to the first automatic adjustment circuit 1140 of FIG. 11.

Compared with FIG. 1, the second automatic adjustment circuit 1150 is further configured in the multi-phase clock generator 1100 of FIG. 11. The difference between the automatic adjustment circuit 140 and the second automatic adjustment circuit 1150 is that the feedback signal of the second automatic adjustment circuit 1150 is from the second oscillator circuit 1120. That is to say, the feedback signal received by the second automatic adjustment circuit 1150 may be one of the second output clock signals or a pair of differential signals of the second output clock signals. The second automatic adjustment circuit 1150 may determine whether the current of the current source array 1130 is adjusted again to achieve better current adjustment effect and make the frequency of the second output clock signals output by the second oscillator circuit 1120 and the first output clock signals received by the second oscillator circuit 1120 may tend to equal. Except for the above difference, the above operations and structure of the automatic adjustment circuit 140 also may be applied to the second automatic adjustment circuit 1150 of FIG. 11.

Figure 12:
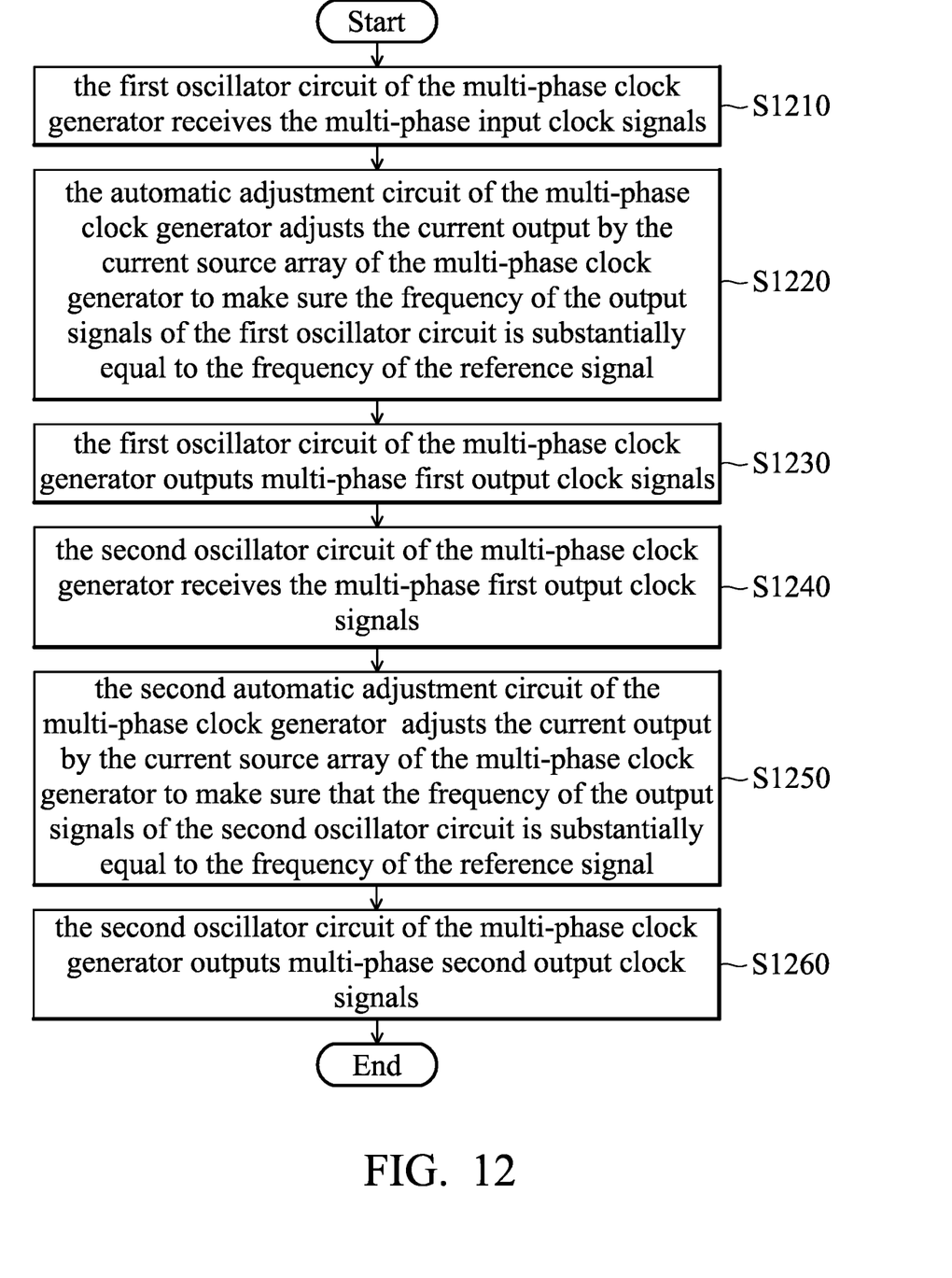
FIG. 12 is a flow chart illustrating a multi-phase clock-generating method according to another embodiment of the application.

FIG. 12 is a flow chart illustrating a multi-phase clock-generating method according to another embodiment of the application. The multi-phase clock-generating method may be applied to the multi-phase clock generator 1100. As shown in FIG. 12, in step S1210, the first oscillator circuit of the multi-phase clock generator 1100 receives the multi-phase input clock signals, wherein the first oscillator circuit comprises a plurality of first delay circuits.

In step S1220, the first automatic adjustment circuit of the multi-phase clock generator 1100 adjusts the current output by the current source array of the multi-phase clock generator 1100 to make sure that the frequency of the output signals of the first oscillator circuit is substantially equal to the frequency of the reference signal.

In step S1230, the first oscillator circuit of the multi-phase clock generator 1100 outputs multi-phase first output clock signals, wherein the number of multi-phase first output clock signals is greater than the number of multi-phase input clock signals.

In step S1240, the second oscillator circuit of the multi-phase clock generator 1100 receives the multi-phase first output clock signals, wherein the second oscillator circuit comprises a plurality of second delay circuits.

In step S1250, the second automatic adjustment circuit of the multi-phase clock generator 1100 adjusts the current output by the current source array of the multi-phase clock generator 1100 to make sure that the frequency of the output signals of the second oscillator circuit is substantially equal to the frequency of the reference signal.

In step S1260, the second oscillator circuit of the multi-phase clock generator 1100 outputs multi-phase second output clock signals, wherein the number of second delay circuits is less than the number of first delay circuits, and the number of multi-phase second output clock signals is the same as the number of multi-phase first output clock signals.

In addition, in the multi-phase clock-generating method provided in the application, the automatic adjustment circuits may compensate the process, voltage and temperature (PVT) affection in the first oscillator circuit and the second oscillator circuit of the multi-phase clock generator.

Use of ordinal terms such as "first", "second", "third", etc., in the disclosure and claims is for description. It does not by itself connote any order or relationship.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor may read information (e.g., code) from and write information to the storage medium. A sample storage medium may be integral to the processor. The processor and the storage medium may reside in an ASIC. The ASIC may reside in user equipment. Alternatively, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

The above paragraphs describe many aspects. Obviously, the teaching of the application may be accomplished by many methods, and any specific configurations or functions in the disclosed embodiments only present a representative condition. Those who are skilled in this technology will understand that all of the disclosed aspects in the application may be applied independently or be incorporated.

While the application has been described by way of example and in terms of preferred embodiment, it should be understood that the application is not limited thereto. Therefore, the scope of the present application shall be defined and protected by the following claims and their equivalents.

What is claimed is:

1. A multi-phase clock generator, comprising:
   a first oscillator circuit, comprising a plurality of first delay circuits, wherein the first oscillator circuit receives a first number of multi-phase input clock signals and outputs a second number of first output clock signals, wherein the second number is larger than the first number; and
   a second oscillator circuit, coupled to the first oscillator circuit and comprising a plurality of second delay circuits, wherein the second oscillator circuit receives the second number of first output clock signals and outputs a second number of second output clock signals, wherein the number of the plurality of the second delay circuits is less than the number of the plurality of the first delay circuits.

2. The multi-phase clock generator of claim 1, wherein the first oscillator circuit comprises a plurality of first output nodes and the second oscillator circuit comprises a plurality of second output nodes, wherein the first output nodes used to output the second number of first output clock signals are coupled to the respective second output nodes.

3. The multi-phase clock generator of claim 1, wherein the number of the plurality of first delay circuits is an odd value.

4. The multi-phase clock generator of claim 1, wherein the number of the plurality of first delay circuits is an even value.

5. The multi-phase clock generator of claim 1, further comprising:
   a current source array, coupled to the first oscillator circuit and the second oscillator circuit,
   wherein the current source array provides currents to the first oscillator circuit and the second oscillator circuit to make the first oscillator circuit and the second oscillator circuit being operated in a fixed frequency range.

6. The multi-phase clock generator of claim 5, further comprising:
   a first automatic adjustment circuit, coupled to the first oscillator circuit and the current source array,
   wherein the first automatic adjustment circuit receives a feedback signal output by the first oscillator circuit and a reference clock signal, and compares the feedback signal with the reference clock signal to adjust the current output by the current source array.

7. The multi-phase clock generator of claim 6, wherein the first automatic adjustment circuit further comprises:
- a first counter, receiving the reference clock signal;
- a second counter, receiving the feedback signal;
- a logic calculation circuit, coupled to the first counter and the second counter, determining whether a first frequency of the reference clock signal is substantially equal to a second frequency of the feedback signal, wherein the multi-phase input clock signals are substantially the first frequency.

8. The multi-phase clock generator of claim 7, wherein when the first frequency is different from the second frequency, the logic calculation circuit outputs an adjustment signal to the current source array to adjust the current output by the current source array.

9. The multi-phase clock generator of claim 6, wherein when the current is adjusted, the frequency range corresponding to the first oscillator circuit is adjusted accordingly.

10. The multi-phase clock generator of claim 6, further comprising:
- a second automatic adjustment circuit, coupled to the second oscillator circuit and the current source array,
- wherein the second automatic adjustment circuit receives a feedback signal output by the second oscillator circuit and the reference clock signal, and compares the feedback signal with the reference clock signal to adjust the current output by the current source array.

11. A multi-phase clock-generating method, applied to a multi-phase clock generator, comprising:
- receiving, by a first oscillator circuit of the multi-phase clock generator, a plurality of multi-phase input clock signals, wherein the first oscillator circuit comprises a plurality of first delay circuits;
- outputting, by the first oscillator circuit, a plurality of multi-phase first output clock signals based on the plurality of multi-phase input clock signals, wherein a number of the multi-phase first output clock signals is larger than a number of the multi-phase input clock signals;
- receiving, by a second oscillator circuit of the multi-phase clock generator, the multi-phase first output clock signals, wherein the second oscillator circuit comprises a plurality of second delay circuits; and
- outputting, by the second oscillator circuit, a plurality of multi-phase second output clock signals, wherein a number of the plurality of second delay circuits is less than a number of the plurality of first delay circuits, and a number of the multi-phase second output clock signals is the same as the number of the multi-phase first output clock signals.

12. The multi-phase clock-generating method of claim 11, wherein the first oscillator circuit comprises a plurality of first output nodes and the second oscillator circuit comprises a plurality of second output nodes, wherein the first output nodes used to output the second number of first output clock signals are coupled to the respective second output nodes.

13. The multi-phase clock-generating method of claim 11, wherein the number of the plurality of first delay circuits is an odd value.

14. The multi-phase clock-generating method of claim 11, wherein the number of the plurality of first delay circuits is an even value.

15. The multi-phase clock-generating method of claim 11, further comprising:
- providing, by a current source array of the multi-phase clock generator, currents to the first oscillator circuit and the second oscillator circuit to make the first oscillator circuit and the second oscillator circuit being operated in a fixed frequency range.

16. The multi-phase clock-generating method of claim 15, further comprising:
- receiving, by a first automatic adjustment circuit of the multi-phase clock generator, a feedback signal output by the first oscillator circuit and a reference clock signal;
- comparing, by the first automatic adjustment circuit, the feedback signal with the reference clock signal to adjust the current output by the current source array.

17. The multi-phase clock-generating method of claim 16, further comprising:
- determining, by the first automatic adjustment circuit, whether a first frequency of the reference clock signal is substantially equal to a second frequency of the feedback signal, wherein the multi-phase input clock signals are substantially the first frequency.

18. The multi-phase clock-generating method of claim 17, further comprising:
- when the first frequency is different from the second frequency, outputting, by the first automatic adjustment circuit, an adjustment signal to the current source array to adjust the current output by the current source array.

19. The multi-phase clock-generating method of claim 16, wherein when the current is adjusted, the frequency range corresponding to the first oscillator circuit is adjusted accordingly.

20. The multi-phase clock-generating method of claim 16, further comprising:
- receiving, by a second automatic adjustment circuit of the multi-phase clock generator, a feedback signal output by the second oscillator circuit and the reference clock signal and comparing the feedback signal with the reference clock signal to adjust the current output by the current source array.

* * * * *